United States Patent [19]
Casper et al.

[11] Patent Number: 5,715,208
[45] Date of Patent: Feb. 3, 1998

[54] MEMORY DEVICE AND METHOD FOR READING DATA THEREFROM

[75] Inventors: Stephen L. Casper; Ward Parkinson, both of Boise, Id.

[73] Assignee: Micron Technology, Inc., Boise, Id.

[21] Appl. No.: 536,005

[22] Filed: Sep. 29, 1995

[51] Int. Cl.$^6$ .................. G11C 8/00; G11C 7/00
[52] U.S. Cl. .................. 365/230.08; 365/233.5; 365/236; 365/194
[58] Field of Search .................. 365/189.05, 194, 365/230.06, 230.08, 233.5, 236

[56] References Cited

U.S. PATENT DOCUMENTS 5,526,320  6/1996  Zagar et al. .................. 365/233.5

*Primary Examiner*—David C. Nelms
*Assistant Examiner*—Trong Quang Phan
*Attorney, Agent, or Firm*—Seed and Berry LLP

[57] ABSTRACT

A memory device includes an array of memory cells arranged in rows and columns. A row-address decoder allows a row address to propagate therethrough while a row address strobe is at an inactive logic level. In response to a transition of the row address strobe from the inactive level to an active level, the decoder enables a row of memory cells selected by the row address. A row-address latch stores the row address in response to the transition of the row address strobe. The memory device may also include a transition detector that monitors the row address for a transition thereof. A delay circuit is coupled to the decoder, the latch, and the detector. If the monitor detects a transition of the row address, the delay circuit delays the enabling of the row of memory cells and the storing of the row address at least predetermined time after such a transition. Alternatively, the memory device may include a row decoder that is coupled between the latch and the array, and enables a row of memory cells identified by the row address. A control circuit is coupled to the array, receives the row address strobe, and enables the array to output additional data from the identified row even when the row address strobe is at the inactive level. Furthermore, the memory device may include both the control circuit and the row decoder that allows the row address to propagate therethrough while the row address strobe is at an inactive level.

29 Claims, 11 Drawing Sheets

MEMORY DEVICE AND METHOD FOR READING DATA THEREFROM

TECHNICAL FIELD

The present invention relates generally to electronic devices and more specifically to memory devices and methods for reading data therefrom.

BACKGROUND OF THE INVENTION

Computer designers are always searching for faster memory devices that will allow them to design faster computers. Typically, a computer's operating speed depends upon the time required to transfer, i.e., read or write, data between a processor and a memory circuit, such as a dynamic random access memory (DRAM). Such a memory circuit usually includes a large number of memory cells that are arranged in rows and columns. These cells store both data for the processor to operate on and the results of such operations. Therefore, the more quickly the processor can access the data within these memory cells, the more quickly it can perform a calculation or execute a program that uses this data.

Typically, to read data from a memory device, a computer processor or other addressing circuit generates row and column addresses on an address bus and row and column address strobes (RAS and CAS respectively) on respective strobe lines. The data that the memory device provides to the processor, i.e., the data read by the processor, are stored in the unique memory cells that are part of both the selected rows and the corresponding selected columns. Such a memory device can often operate in at least four read modes or cycles: nibble, burst extended data out (EDO), page mode, and conventional read. The term "extended data out" indicates that the memory device can place valid data on the DATA bus even when CAS is in an inactive state.

Referring to the timing diagram of FIG. 1, to initiate a nibble read cycle, the processor (not shown) generates a row address on the address bus. Next, the processor transitions $\overline{RAS}$ from a first inactive state or logic level to a second active state or logic level so that the memory device stores or latches the row address. The processor then generates a column address on the address bus and transitions $\overline{CAS}$ from an inactive to an active level. In this embodiment, the active logic level is logic 0 and the inactive logic level is logic 1 for both $\overline{RAS}$ and $\overline{CAS}$. (The bar over the signal name indicates the signal is active low.) Other embodiments, however, may use different logic levels for the active and inactive levels. Furthermore, a transition from logic 1 to logic 0 is referred to as a falling edge, and a transition from a logic 0 to logic 1 is a rising edge.

In response to the $\overline{CAS}$ transition, the memory device latches the column address and loads into output buffers the data stored in the memory cells located in the addressed row at the column address and at a predetermined number of sequential column addresses in the same row. For example, as shown, if the addressed row and column are at addresses ROW+0 and COL+0 respectively, the memory device loads into the output buffers the contents of the memory cells located in ROW+0 at COL+0, COL+1, and COL+3. Also in response to the $\overline{CAS}$ transition, the output buffer containing the data from COL 0 drives, i.e., places, its contents onto the DATA bus. In response to subsequent falling edges of $\overline{CAS}$, the remaining output buffers are enabled such that they pace their contents on the DATA bus. After it has read the addressed data, the processor transitions both $\overline{CAS}$ and $\overline{RAS}$ to inactive levels to disable the memory from placing data on the DATA bus. Although in this embodiment the memory device is programmed to access the memory cells in four sequential columns, the memory device may access any number, i.e., nibble, of cells in any column position.

Still referring to FIG. 1, and, for example purposes, using a 66 MHz clock, i.e., a clock having a period of 15 nanoseconds and edges labeled 0–12, the nibble read cycle takes between 12–13 clock cycles, i.e., 180–195 nanoseconds. The $t_{RAC}$ time, which is the duration between the falling edge of $\overline{RAS}$ and the time when the memory device first places valid data onto the DATA bus, is between 50 and 60 nanoseconds, and the time $t_{RP}$, which is the time that $\overline{RAS}$ must be at an inactive logic level before the start of the next cycle, is approximately 30–40 nanoseconds. Also as shown, the data on the DATA bus is valid only when $\overline{CAS}$ is at an active level, taking into account the propagation delays within the memory device. Furthermore, after the rising edge of $\overline{RAS}$, if $\overline{CAS}$ goes to a logic 1, no more data can be read from or written to the memory device until $\overline{RAS}$ transitions low to begin the next cycle.

FIG. 2 is a timing diagram that illustrates a burst EDO (BEDO) read cycle. Initially, the processor drives a row address ROW+0 onto the address bus and the memory latches the row address in response to the falling edge of $\overline{RAS}$. The processor then drives a base column address onto the address bus, and in response to the first falling edge of $\overline{CAS}$, the memory latches the base column address. FIG. 2 shows the base column address as an initial column address plus a 0 index, i.e., COL+0. In response to the next falling edge of $\overline{CAS}$, the memory updates the index, and places the data from the 0 index column COL+0 onto the DATA bus. In the illustrated embodiment, the memory increments the index by one to update it, although other embodiments may use other algorithms to update the index to point to any column in the addressed row. In response to each subsequent falling edge of $\overline{CAS}$, the memory updates the index and drives the data from the previously indexed column—COL+1, COL+2, and COL+3 sequentially—onto the DATA bus. This updating and driving sequence continues until the index reaches a predetermined value, which equals three in this embodiment. After the index reaches the predetermined value, the processor places on the address bus the next column address COL+4, which in this embodiment is the sum of the base column address COL+0 and the predetermined index value (3) plus 1. In response to the next falling edge of $\overline{CAS}$ after the index reaches the predetermined value, the memory latches this new column address COL+4 and places on the DATA bus the data from the previously indexed column COL+3, which in this embodiment is the column located at the sum of the base column address COL+0 and the predetermined index value (3). This whole cycle may then repeat itself any number of times, up until the processor has accessed every column (COL+0, COL+1, COL+2, COL+3, COL+4, COL+5 ...) in the addressed row. Thus, during a BEDO read cycle, the memory device can output data from a large number of columns in the same row without requiring the processor to periodically re-address the row. Although not shown, at the end of the BEDO cycle, the processor transitions $\overline{RAS}$ to a logic 1 for at least time $t_{RP}$ before transitioning it to a logic 0 to begin another cycle.

Still referring to FIG. 2, and, for example purposes, using a 66 MHz clock frequency having edges labeled 0–9, the read cycle requires a time that is approximately equal to the sum of the number of columns accessed times the clock period (15 ns), $t_{RAC}$, and $t_{RP}$ (not shown). In this example, $t_{RAC}$ is approximately 60–75 nanoseconds, and $t_{RP}$ is approximately 30–40 nanoseconds. Also, after the rising edge of $\overline{RAS}$, the read cycle ends if $\overline{CAS}$ is a logic 1, or, if CAS is a logic 0, when $\overline{CAS}$ transitions to a logic 1. Once the read cycle ends, the memory device cannot place valid data on or retrieve valid data from the DATA bus until the next read or write cycle.

FIG. 3 is a timing diagram of a page mode EDO read cycle. Initially, the processor drives the row address onto the address bus and the memory latches the row address in response to the falling edge of $\overline{RAS}$. The processor then drives a column address onto the address bus. In response to the first falling edge of $\overline{CAS}$, the memory latches the column address, and places on the DATA bus the data from the memory cell located at the column (COL+0) and row (ROW+0) addresses. The processor then drives a second column address onto the address bus, here COL+1. In response to the next falling edge of $\overline{CAS}$, the memory latches this column address COL+1 and places on the DATA bus the data from the memory cell located at the second column address (COL+1) and the row address (ROW+0). As shown, such a sequence can continue for any number of $\overline{CAS}$ cycles up until every column (COL+2, COL+3, . . . COL+(N−1), COL+N . . . ) in the addressed row has been read. The processor then transitions $\overline{RAS}$ and $\overline{CAS}$ high to end the read cycle. The page mode EDO is similar to both the nibble and BEDO read cycles in that multiple columns can be read from a single row that has been addressed only once. Unlike the nibble and the BEDO cycles, in which the memory generates most of the column addresses internally, when operating in the page mode EDO, the processor must supply each column address to the memory.

Still referring to FIG. 3, and using, for example purposes, a 66 MHz clock having edges labeled 0–9, k, and k+1, the page mode EDO read cycle requires a time that is approximately equal to the sum of $t_{RAC}$, the number of $\overline{CAS}$ cycles times four clock periods, and $t_{RP}$. In this example, $t_{RAC}$ is approximately 50–60 nanoseconds, and $t_{RP}$ is approximately 30–40 nanoseconds. Also, DATA bus after the rising edge of $\overline{RAS}$, the page mode EDO cycle ends if $\overline{CAS}$ is inactive logic 1 , or in response to the next rising edge of $\overline{CAS}$.

FIG. 4 is a timing diagram of a normal-mode read cycle. Initially, the processor drives the row address ROW+0 onto the address bus and the memory latches the row address in response to the falling edge of $\overline{RAS}$. The processor then drives a column address (COL+0) onto the address bus. In response to the falling edge of $\overline{CAS}$, the memory latches the column address (COL+0), and places on the DATA bus the data from the memory cell located at the column and row addresses. The processor then transitions $\overline{CAS}$ to a logic 1 to disable the memory from outputting data. A predetermined time later, the processor transitions $\overline{RAS}$ to a logic 1 for at least the predetermined time $t_{RP}$, before transitioning $\overline{RAS}$ to a logic 0 to begin the next cycle, which, for example, accesses ROW+1. Thus, the normal-mode read mode is typically used to address a single column in a row.

Still referring to FIG. 4, and using for example purposes a 66 MHz clock having edges labeled 0–9, the normal-mode read cycle requires approximately 9 clock cycles. In this example, $t_{RAC}$ is approximately 50–60 nanoseconds, and $t_{RP}$ is approximately 30–40 nanoseconds. Also, DATA bus after the rising edge of $\overline{RAS}$, the convention read cycle ends if $\overline{CAS}$ is at an inactive logic 1, or in response to the next rising edge of $\overline{CAS}$.

Attempts to decrease the cycle times for the nibble, BEDO, page EDO, normal-mode, and other read modes have focused on increasing the frequency of the system clock. With today's integrated circuit technology, however, the speed of the clock is limited by the propagation and other delay times associated with memory devices.

SUMMARY OF THE INVENTION

In accordance with one aspect of the invention, a memory device includes an array of memory cells arranged in rows and columns. A row-address decoder allows a row address to propagate therethrough while a row address strobe is at an inactive logic level. In response to a transition of the row address strobe from the inactive level to an active level, the decoder enables a row of memory cells selected by the row address. A row-address latch stores the row address in response to the transition of the row address strobe. In a related aspect of the invention, the memory device also includes a transition detector that monitors the row address for a transition thereof. A delay circuit is coupled to the decoder, the latch, and the detector. If the monitor detects a transition of the row address, the delay circuit delays the enabling of the row of memory cells and the storing of the row address at least a predetermined time after such a transition.

In accordance with another aspect of the invention, a memory device includes an array of memory cells that store data and are arranged in rows and columns. A row latch receives a row address and a row address strobe, and stores the row address in response to a transition of the row address strobe from an inactive to an active logic level. A row decoder is coupled between the latch and the array, and enables a row of memory cells identified by the row address. A control circuit is coupled to the array, receives the row address strobe, and enables the array to output data from the identified row when the row address strobe is at the active level, and to output additional data from the identified row when the row address strobe is at the inactive level.

In accordance with yet another aspect of the invention, a memory device includes an array of memory cells that store data and are arranged in rows and columns. A row latch stores a row address in response to a first transition of a row address strobe from a first to a second logic level. A row decoder is coupled between the row latch and the array, allows the row address to propagate through itself before the first transition, and enables a row of memory cells selected by the row address in response to the first transition. A control circuit is coupled to the array, receives the row address strobe, and enables the array to output data when the row address strobe is at the second logic level, and to output additional data when the row address strobe is at the first level.

An advantage provided by the invention is a decrease in the duration of the read cycle without an increase in the clock frequency. In one aspect of the invention, this decrease is realized by decreasing the $t_{RAC}$ time. In another aspect of the invention, this decrease is realized by relocating the $t_{RP}$ time within the read cycle. In still another aspect of the invention, the read cycle duration is decreased by combining a reduced $t_{RAC}$ time and a relocated $t_{RP}$ time.

DETAILED DESCRIPTION OF THE INVENTION

Figure 1:
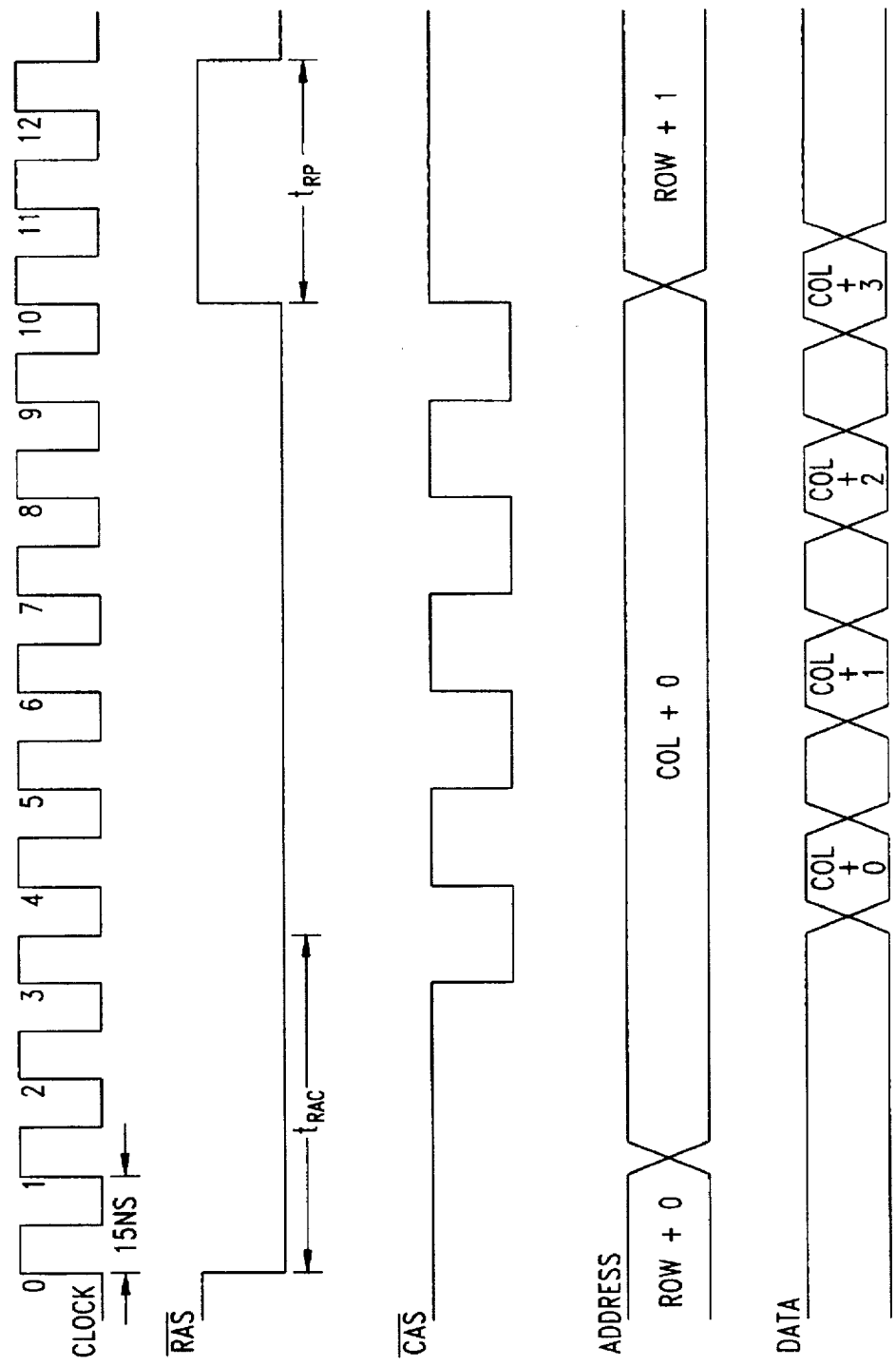
FIG. 1 is a timing diagram of a known nibble read cycle.
Figure 5:
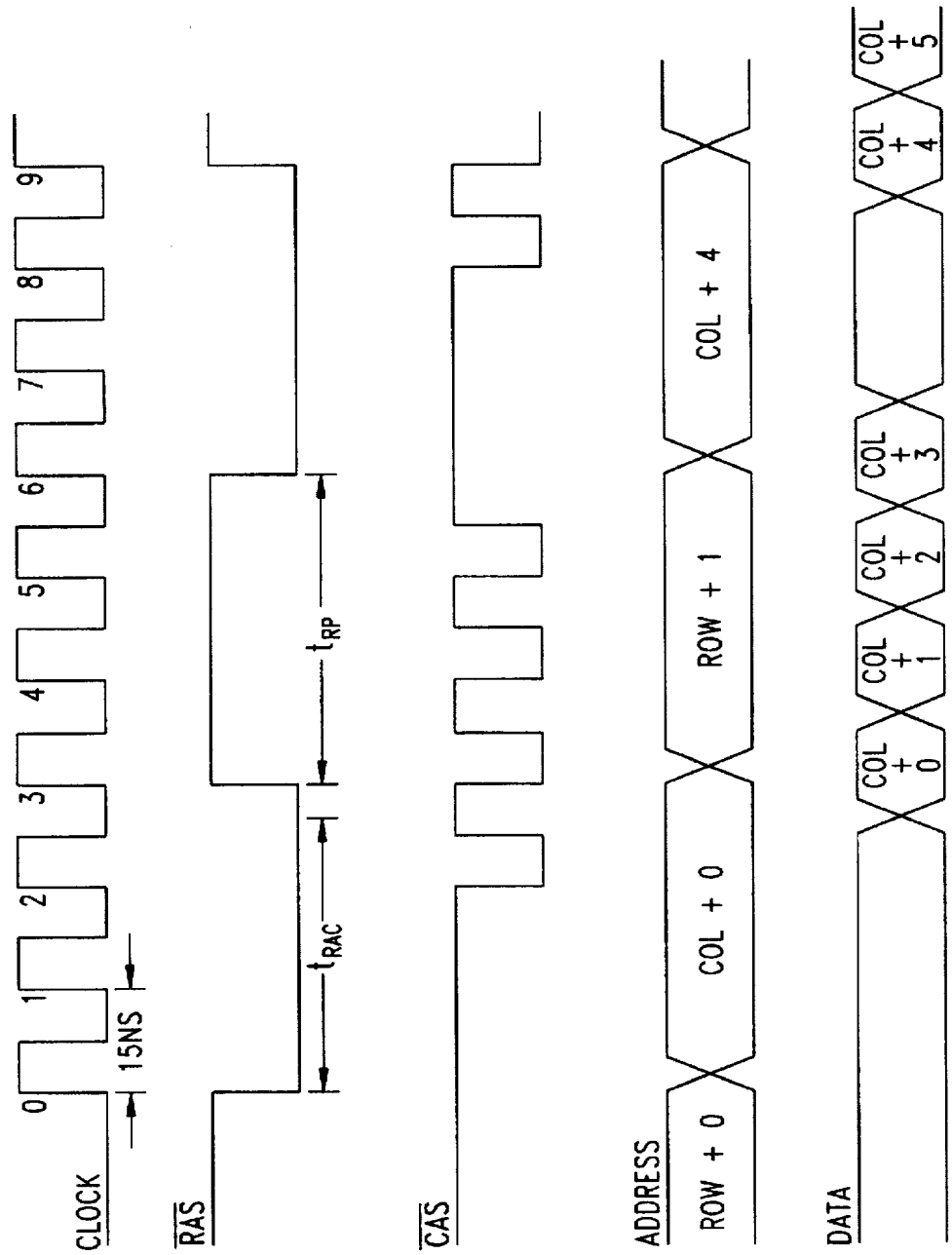
FIG. 5 is a timing diagram of a nibble EDO read cycle according to the present invention.

FIG. 5 is a timing diagram of a nibble EDO read cycle in accordance with the present invention. Unlike the known nibble EDO read cycle of FIG. 1, before the beginning of the cycle, i.e., before the falling edge of $\overline{RAS}$, the memory device 10 allows the row address to propagate through the row decoder 32. The memory device 10, row decoder 32, and associated circuitry are discussed below in conjunction with FIG. 9. Thus, when $\overline{RAS}$ falls, the memory device 10 latches the row address ROW+0 and enables the row decoder 32 to select the addressed row. Because the memory 10 allows the row address to propagate through the decoder 32 prior to the falling edge of $\overline{RAS}$, the $t_{RAC}$ time is significantly reduced from the 45–60 nanoseconds of the prior art (FIG. 1) to 30–45 nanoseconds. The propagation of the row address through the row decoder 32 before the falling edge of $\overline{RAS}$ is referred to as "positive row setup."

Additionally, the memory 10 can place additional data onto the DATA bus even after the rising edge of $\overline{RAS}$, i.e., during $t_{RP}$. That is, unlike in the prior art, falling edges of $\overline{CAS}$ that occur after the rising edge of $\overline{RAS}$ will cause new data to be driven onto the DATA bus. Inherent in this technique is that the memory 10 can output valid data even after both $\overline{RAS}$ and $\overline{CAS}$ transition to inactive logic levels. Thus, $t_{RP}$ is effectively shifted approximately 7 clock cycles toward the beginning of the read cycle to further reduce the read cycle's duration. Therefore, the present invention reduces the overall read cycle from approximately 12–13 clock cycles (FIG. 1) to approximately 6 clock cycles. The reading of additional data from the memory 10 after the rising edge of $\overline{RAS}$ is often referred to as an "extended read."

The memory 10 may employ positive row setup, extended read, or both to shorten a nibble EDO read cycle. The memory 10 accomplishes this shortening without increasing the clock frequency and without decreasing the time during which a bit of data is valid on the DATA bus. As discussed further below in conjunction with FIG. 9, signals other than $\overline{RAS}$ and $\overline{CAS}$ may be used to disable the data output of the memory 10 between read or write cycles. Or, the last bit of data read may remain valid on the DATA bus until the first bit of data is read or written during a subsequent read or write cycle respectively.

Still referring to FIG. 5, the nibble EDO read cycle is discussed in more detail. Before the beginning of the read cycle, the processor (not shown) provides the row address ROW+0 on the address bus a predetermined time before the falling edge of $\overline{RAS}$. This predetermined time is sufficient to allow the row address to propagate through the row decoder 32. In one embodiment of the invention, this predetermined time is approximately 20 nanoseconds. In response to the falling edge of $\overline{RAS}$, the row decoder 32 enables the addressed row, i.e., places an active voltage level (between 3–6 volts in one embodiment of the invention) on the word line associated with the addressed row. Such enabling of the addressed row is often referred to as "firing the word line."

Next, the processor provides a base column address COL+0 on the address bus. In response to the first falling edge of $\overline{CAS}$, the memory 10 latches the base column address COL+0 and outputs the data from the memory cell located at the intersection of the row and the base column address. Additionally, the memory 10 use predetermined indexes to latch a predetermined number of additional column addresses within the same row. In this embodiment, the predetermined indexes are 1, 2, and 3, and the predetermined number of additional columns is three, i.e., COL+1, COL+2, COL+3. That is, in this embodiment, the nibble EDO read cycle consists of outputting the data from four columns for each column address the processor provides. Additionally, in response to the first falling edge of $\overline{CAS}$, the memory 10 outputs the data from the base column COL+0. In response to the following three falling edges of $\overline{CAS}$, the memory outputs the data from the indexed columns COL+1, COL+2, and COL+3 as shown. In other embodiments, a different number of columns may be addressed in a different order.

At some predetermined time after the falling edge of $\overline{RAS}$, approximately three clock cycles in this embodiment, the processor transitions $\overline{RAS}$ to a logic 1. (The clock signal has edges labeled 0–9.) As shown, the memory 10 outputs additional data even after the rising edge of $\overline{RAS}$ and while $\overline{RAS}$ is at a logic 1. At some time after the rising edge of $\overline{RAS}$, the processor drives the address bus with the next row address ROW+1, which as discussed above, propagates through the row decoder 32. After at least time $t_{RP}$, which in this embodiment extends beyond the last falling edge of $\overline{CAS}$, the processor transitions $\overline{RAS}$ to a logic 0 to initiate another read cycle and read data from the cells at ROW+1 and columns in that row, for example, COL+4, COL+5...

Although FIG. 5 shows successive read cycles, other cycles, such as a write cycle, may precede or follow a read cycle without departing from the spirit and scope of the invention. Additionally, although the nibble EDO mode is described as reading four columns of data per cycle, the memory 10 may be constructed to allow the reading of a greater or lesser predetermined number of bits without departing from the spirit and scope of the invention.

Figure 6:
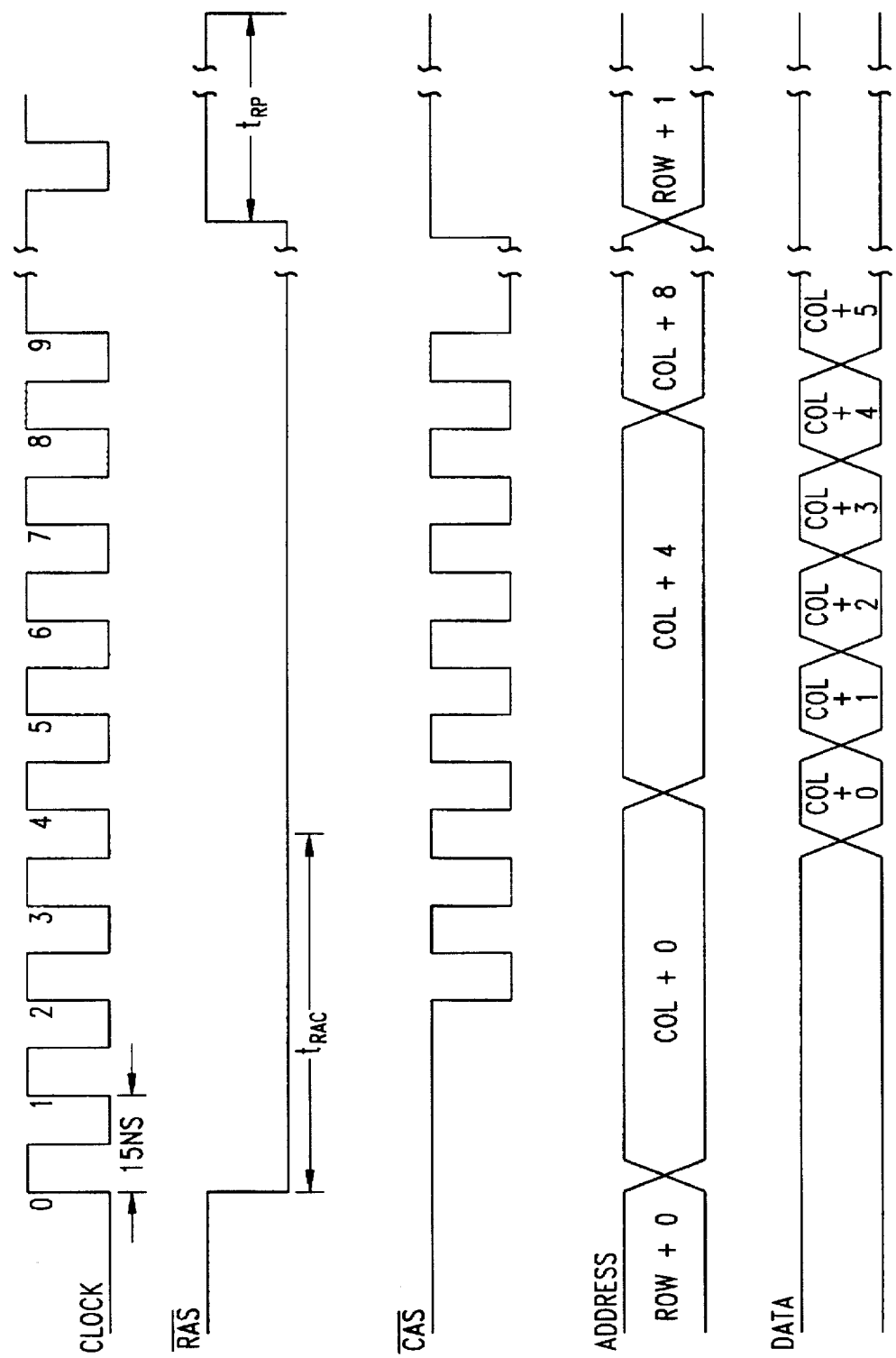
FIG. 6 is a timing diagram of a BEDO read cycle according to the present invention.

FIG. 6 is a timing diagram of a BEDO read cycle according to the present invention. As discussed above in conjunction with FIG. 5, either the positive row set up technique, extended read technique, or both may be used to shorten the BEDO read cycle by respectively decreasing $t_{RAC}$ and effectively moving $t_{RP}$ back toward the beginning of the read cycle. Thus, the BEDO read cycle according to the present invention is significantly shorter than prior BEDO cycles. (The clock includes edges labeled 0–9.)

More specifically, the processor places onto the address bus a first row address, here shown as a base row address plus index 0, i.e., ROW+0. This row address propagates through the decoder 32 of the memory device 10. In response to falling edge of $\overline{RAS}$, the decoder 32 enables the addressed row within the memory 10. Next, the processor places a base column address onto the address bus, here column plus index 0, i.e., COL+0. In response to the first falling edge of $\overline{CAS}$, the memory 10 latches the base column address COL +. In response to the next falling edge of CAS, the memory 10 updates the base column address to the next indexed column address COL+1 to be read, and places onto the DATA bus the data stored at the base column address COL+0. Here, such updating consists of incrementing the index by one. In response to each of a subsequent predetermined number of CAS falling edges, the memory 10 updates the previous column address to the next indexed column address, and places onto the DATA bus the data from the previous indexed column address (COL+1, COL+2). After the column address has been updated a predetermined number of times, three in this embodiment, in response to the next falling edge of CAS, the memory 10 latches another base column address, here COL+4, and places onto the DATA bus the data from the previous column address, here COL+3, that is indexed with respect to the previous base column address.

Thus, in this embodiment, in response to the first falling edge of CAS, the address column plus index 0 (COL+0) is latched. On the second falling edge of CAS, the latched address is incremented by one to column plus 1 (COL+1), and the data stored at column plus 0 (COL+0) appears on the DATA bus. In response to the third falling edge of CAS, the previously updated address, column plus 1 (COL+1), is incremented to column plus 2 (COL+2), and the data stored at column plus 1 appears on the DATA bus. In response to the fourth falling edge of CAS, the previously updated column address, column plus 2, is incremented to column plus 3 (COL+3), and the data from column plus 2 appears on the DATA bus. In response to the fifth falling edge of CAS, the memory 10 latches a column plus 4 (COL+4) from the address bus, and places onto the DATA bus the data stored at column plus 3 (COL+3). On the sixth falling edge of CAS, the memory device increments the newly latched base column address, column plus 4, to column plus 5 (COL+5), and places onto the DATA bus the data stored at column plus 4. This sequence continues for a predetermined number of CAS cycles, or until the processor signals the memory 10 device to halt the BEDO read cycle.

Figure 2:
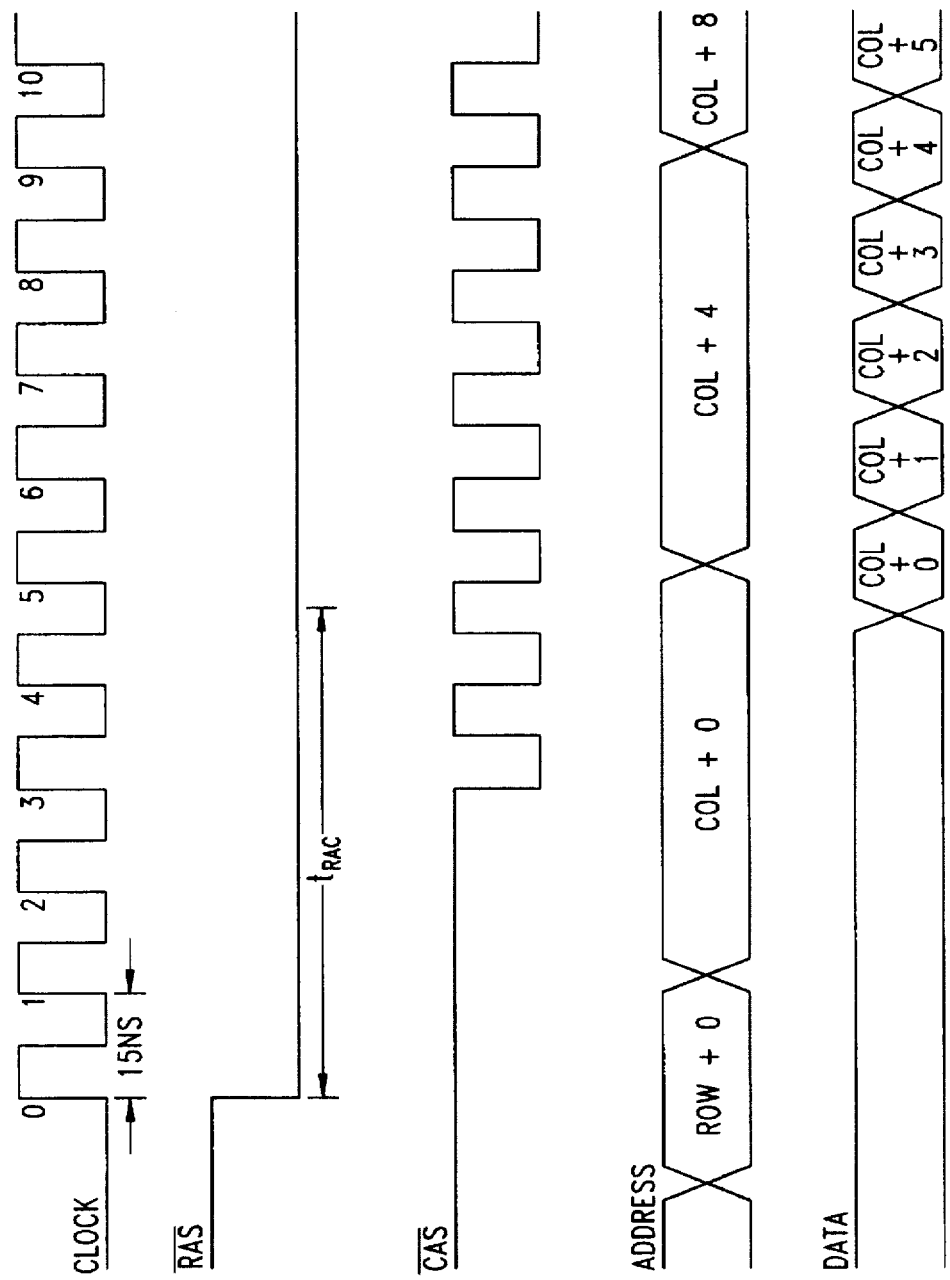
FIG. 2 is a timing diagram of a known BEDO read cycle.

At some point while it is reading data from the addressed columns in the addressed row of the memory 10, the processor transitions RAS to a logic high until at least the end of the BEDO read cycle or for time $t_{RP}$, whichever is longer. Thus, as discussed above, $t_{RP}$ is effectively moved toward the beginning of the read cycle to allow the next read or write cycle to begin a shorter time after the end of the read cycle than after the end of the prior BEDO read cycle of FIG. 2. As shown, the memory 10 can output additional columns of data even after RAS goes high. Also, if the next cycle is another read cycle, the memory 10 then latches the next row address, here row plus 1 (ROW+1), on the next falling edge of RAS.

Figure 7:
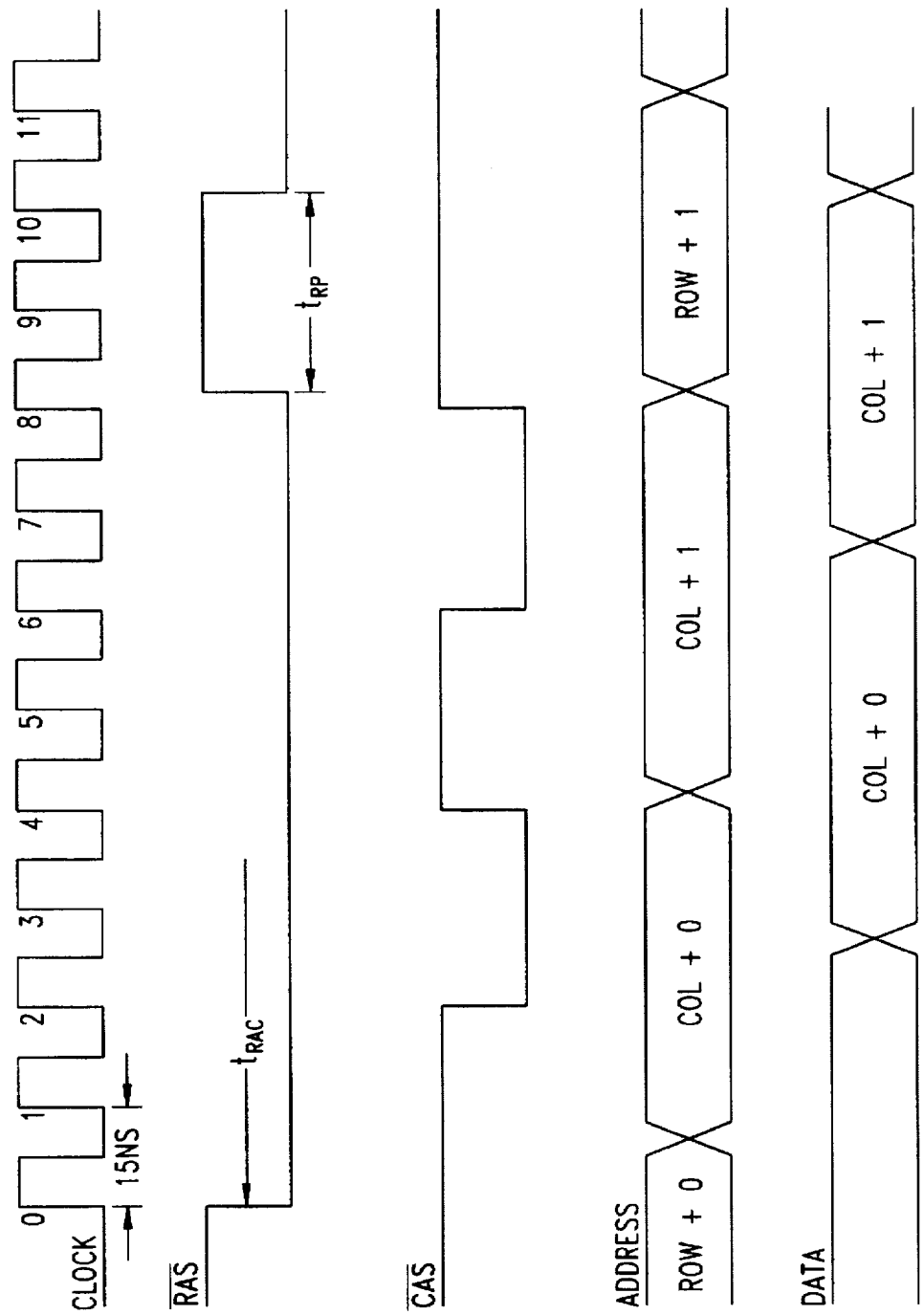
FIG. 7 is a timing diagram of a page mode EDO read cycle according to the present invention.

FIG. 7 is a timing diagram of a page mode EDO read cycle in accordance with the present invention. As discussed above in conjunction with FIGS. 5 and 6, either the positive row set up technique, the extended read technique, or both are used to decrease the time of this page mode EDO read cycle as compared to the known page mode read cycle of FIG. 3. Specifically, the processor first drives the address bus with row address, here row plus 0 (ROW+0), which propagates through the row decoder 32 before the falling edge of RAS. In response to the falling edge of RAS, the row decoder 32 fires the word line of the row identified by the latched row address. The processor then drives the address bus with a column address, here column plus 0 (COL+0). In response to the first falling edge of CAS, the memory 10 latches the column address and drives the DATA bus with the data stored at the latched column address. The processor then transitions CAS high and places on the address bus a second column address, here column plus 1 (COL+1). On the next falling edge of CAS, the memory device 10 latches the second column address and places the data stored at the second column address onto the DATA bus. This sequence of placing column addresses on the address bus and toggling CAS may continue any number of times up until all the columns of the addressed row have been read. Sometime prior to the end of the cycle, the processor transitions RAS to a high level for at least the predetermined time $t_{RP}$. The processor may then transition RAS low again to start another read cycle, for example to read memory cells at the row address ROW+1.

Figure 3:
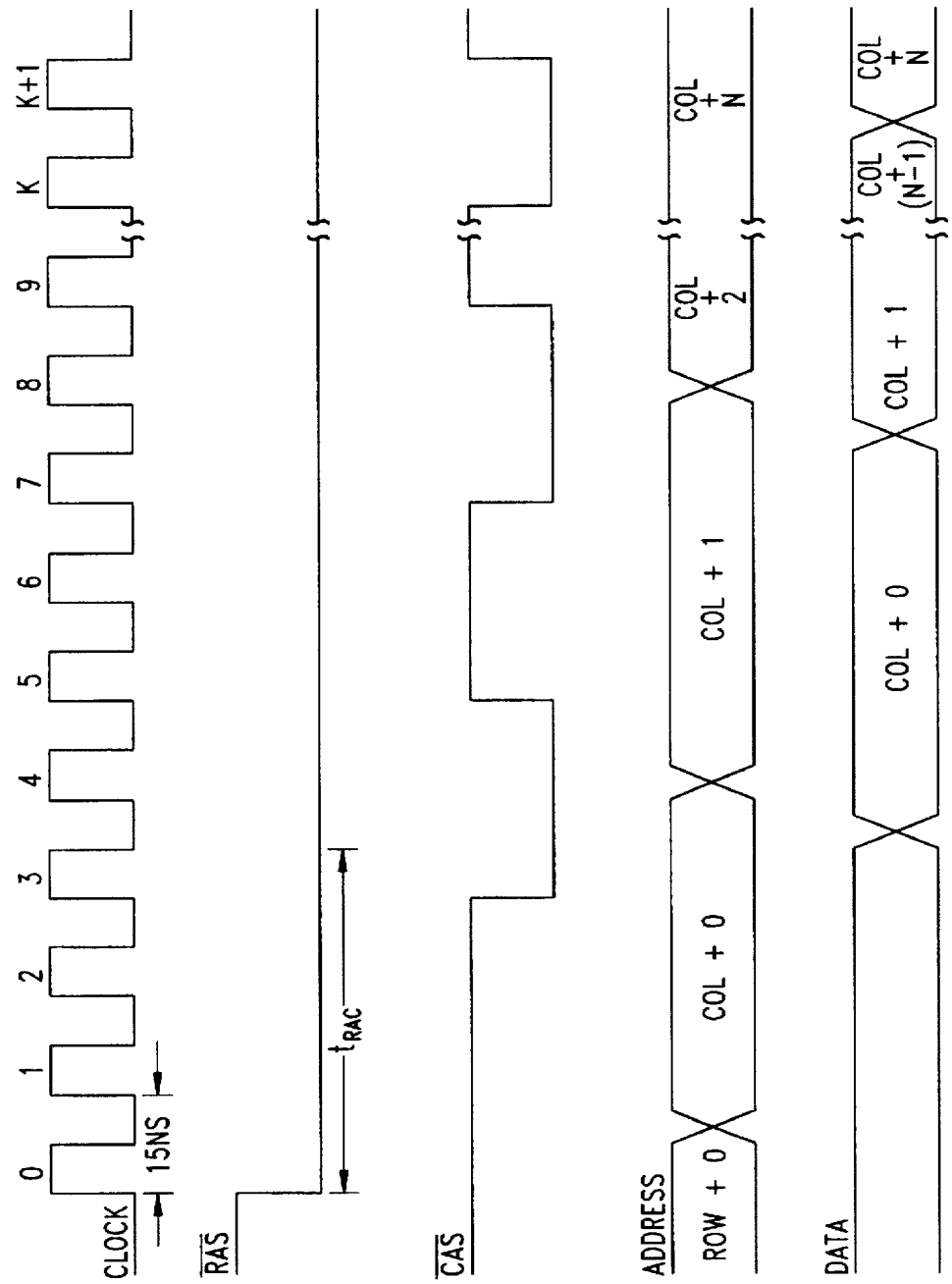
FIG. 3 is a timing diagram of a known page mode EDO read cycle.

As shown for a 66 MHz clock (the clock includes edges that are labeled 0–11 ), the $t_{RAC}$ time for the page mode EDO read cycle of FIG. 7 is approximately 35–45 nanoseconds, as compared with the 50–60 nanoseconds for the known page mode EDO read cycle of FIG. 3. Furthermore, the $t_{RP}$ time is moved back toward the beginning of the read cycle to further shorten the read cycle. Also as shown, the memory 10 can output valid data onto the DATA bus even after both CAS and RAS go inactive high. Although not shown, the memory 10 can output additional columns of data even after RAS goes high.

Figure 4:
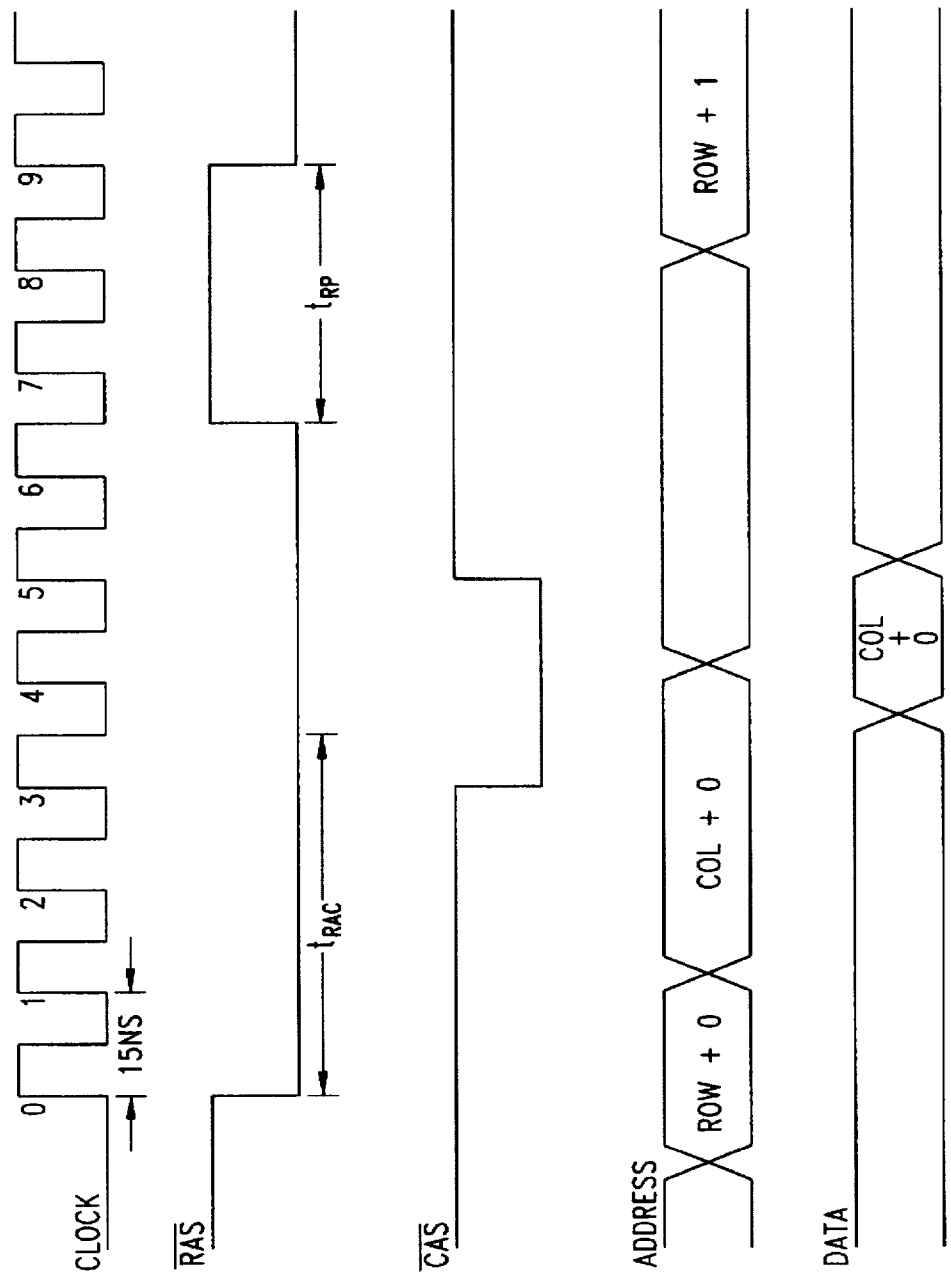
FIG. 4 is a timing diagram of a known conventional read cycle.
Figure 8:
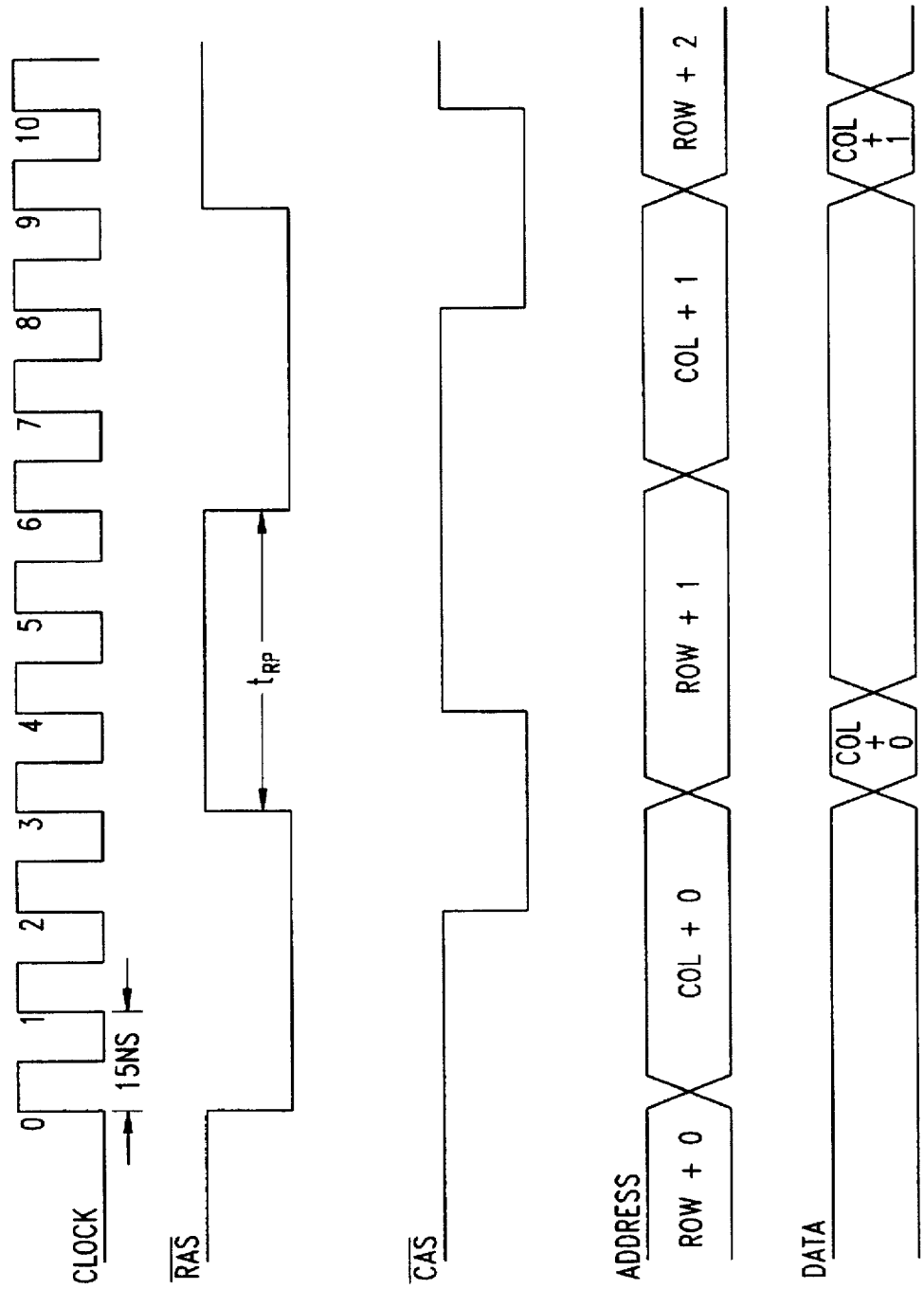
FIG. 8 is a timing diagram of a normal-mode read cycle according to the present invention.

FIG. 8 is a timing diagram of a normal-mode read cycle in accordance with the present invention. As discussed above in conjunction with FIGS. 5–7, either the positive row set up technique, the extended read technique, or both are used to decrease the time of this normal-mode read cycle as compared to the known normal-mode read cycle of FIG. 4. FIG. 8 illustrates the use of the positive row setup technique.

Specifically, the processor first drives the address bus with a row address, here row plus 0 (ROW +), which propagates through the row decoder 32 before the falling edge of RAS. In response to the falling edge of RAS, the row decoder 32 fires the word line of the row identified by the row address. The processor then drives the address bus with a column address, here column plus 0 (COL+0). In response to the first falling edge of CAS, the memory 10 latches the column address (COL+0) and drives the DATA bus with the data stored at the latched column address (COL+0). Sometime after the falling edge of CAS but before the rising edge of CAS, the processor generates the rising edge of RAS. At some time later, the processor generates the rising edge of CAS to disable the data output of the memory 10. The processor may then initiate another read cycle, for example, to read data from COL+1 and ROW+1. As shown for a 66 MHz clock (the clock includes edges that are labeled 0–10), the normal-mode read cycle according to the present invention is approximately 3 clock cycles shorter than the prior conventional read cycle of FIG. 4. Although not shown, the memory 10 can be constructed to allow valid data to remain on the DATA bus even after both RAS and CAS go inactive high.

Figure 9:
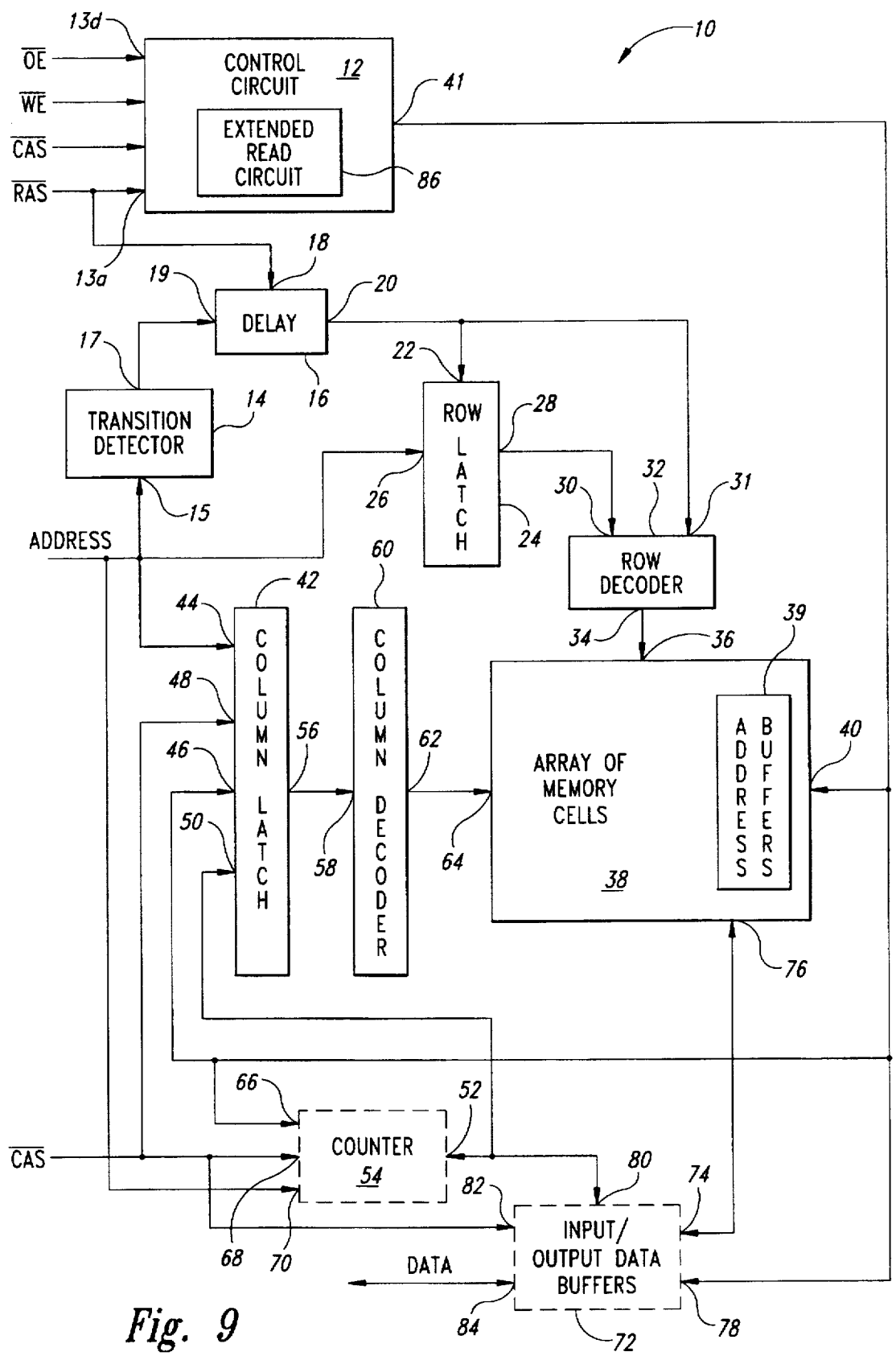
FIG. 9 is a block diagram of a memory device according to the present invention.

FIG. 9 is a block diagram of the memory device 10 according to the present invention. In one embodiment of the invention, the memory device 10 may be a DRAM. Memory device 10 includes an extended-read control circuit 12, which receives at its inputs 13a–d the signals RAS, CAS, write enable (WE), and output enable (OE). An ADDRESS bus is coupled to an input 15 of a transition detector or monitor 14. An output 17 of the monitor 14 is coupled a control input 19 of a delay circuit 16. RAS is coupled to a RAS delay input 18 of delay circuit 16, and a RAS delay output 20 is coupled to a control or latch input 22 of a row latch or buffer 24 and a control input 31 of the row decoder 32. Latch 24 has an input 26 coupled to the ADDRESS bus and an output 28 coupled to an input 30 of the row decoder 32. An output 34 of the row decoder 32 is coupled to a row select input 36 of an array 38 of memory cells, which includes address buffers 39. A control input 40 of the array 38 is coupled to the output 41 of the control circuit 12. A column latch or buffer 42 has an address input 44 coupled to the ADDRESS bus, a control input 46 coupled to the output 41 of the control circuit 12, and a latch input 48 coupled to $\overline{CAS}$. Latch 42 also has a count input 50 that is coupled to a count output 52 of an optional counter 54. An output 56 of the latch 42 is coupled to an input 58 of a column decoder 60. An output 62 of the column decoder 60 is coupled to the column-select input 64 of the array 38. The counter 54 includes a control input 66 coupled to the output 41 of the control circuit 12, an input 68 coupled to $\overline{CAS}$, and a load input 70 coupled to the ADDRESS bus. A bank of input/output data buffers 72 has a data terminal 74 coupled to a data terminal 76 of the array 38. Bank 72 also has a control terminal 78 coupled to the output circuit 41 of the control circuit 12, a count terminal 80 coupled to the output 52 of the counter 54, an input 82 coupled to $\overline{CAS}$, and an I/O data port 84 coupled to a DATA bus.

In operation during the nibble EDO read cycle of FIG. 5, transition detector 14 monitors the ADDRESS bus to detect any high-to-low or low-to-high transitions on any of the address bit lines composing the ADDRESS bus. To prevent addressing errors, it is often desirable that latch 24 waits until the row address has been stable for a predetermined time before latching it. In one embodiment of the invention, this predetermined time may be 5 nanoseconds. If the transition detector 14 detects a transition in one or more bits of the row address, it signals the delay circuit 16 to generate at its output 20 a delayed falling edge of $\overline{RAS}$. If no such transition is detected, delay circuit 16 couples $\overline{RAS}$ directly from its input 18 to its output 20.

As discussed above in conjunction with FIGS. 5–8, before the falling edge of $\overline{RAS}$, the row address on the ADDRESS bus propagates through the row latch 24 and through row decoder 32 to a point prior to output 34. Thus, the row address propagates through most of the circuitry of decoder 32, but decoder 32 does not yet generate a signal to enable the addressed row of the array 38. In response to the falling edge of $\overline{RAS}$, and assuming there are no detected transitions of the row address, the row latch 24 stores the row address and row decoder 32 fires the word line of the addressed memory row of the array 38.

At some time later, the processor (not shown) puts onto the ADDRESS bus the base column address, which propagates through the column latch 42 and the column decoder 60. In response to the first falling edge of $\overline{CAS}$, both the latch 42 and the counter 54 store the base column address. The data stored in the memory cells located at these column addresses is loaded into the buffers 72. Furthermore, the counter 54 enables the data buffer 72 that contains the data from the base column location to place its contents onto the DATA bus via the port 84. In response to the next falling edge of $\overline{CAS}$, counter 54 updates its count value, which presently is the base column address, and provides this updated count value to buffers 72 to enable another buffer to place its contents onto the DATA bus. This sequence continues for the predetermined number of $\overline{CAS}$ falling edges, so that all the data from the base and indexed columns is placed onto the DATA bus.

In one embodiment of the invention as illustrated in FIG. 5, counter 54 updates its count value by incrementing it by one in response to each of the $\overline{CAS}$ falling edges. Furthermore, as discussed above in conjunction with FIG. 5 and below in conjunction with FIG. 10, extended-read control circuit 12 allows array 38 and buffers 72 to place additional data on the DATA bus even after the rising edge of $\overline{RAS}$ and while $\overline{RAS}$ is at a logic 1.

In operation during the BEDO read cycle of FIG. 6, after the row address propagates through decoder 32 and has been latched by latch 24, after the decoder 32 fires the word line of the addressed row in array 38, and after the processor places onto the ADDRESS bus a base column address, in response to the first falling edge of $\overline{CAS}$, the latch 42 and the counter 54 store the base column address. The array 38 loads the data from the cell located at the base column address into a buffer 72. In response to the next falling edge of $\overline{CAS}$, the buffer 72 places its data contents onto the DATA bus via the port 84, and the counter 54 updates the count value and provides this updated count value to the column latch 42 as an indexed column address. The control circuit 12 signals latch 42 to store this indexed column address from the counter 54. This indexed column address propagates through the column decoder 60 to the array 38, which provides the data at the indexed column address to the terminal 74 of the buffer 72.

In response to the next falling edge of $\overline{CAS}$, the buffer 72 acquires the data at input 74 and places this data onto the DATA bus. Also, the counter 54 updates its count value and inputs this to the column latch 42 as another indexed column address. This sequence continues for a predetermined number of $\overline{CAS}$ falling edges. In one embodiment of the invention as illustrated by FIG. 6, the number of $\overline{CAS}$ falling edges after the initial falling edge is four.

In response to the next falling edge of $\overline{CAS}$ following the predetermined number of falling edges, the column latch 42 latches a new base column address from the ADDRESS bus, and the buffer 72 places onto the DATA bus the data from the last indexed column address of the previous sequence. This pipelined operation allows data to be placed onto the DATA bus without interruption in response to each falling edge of $\overline{CAS}$ following the initial falling edge. Thus, the data from a large number of columns in the same row can read by the processor in an efficient manner.

In operation during the page mode EDO read cycle of FIG. 7, after the row address has propagated through the latch 24 and the decoder 32, after the decoder 32 has fired the word line of the addressed row, and after the processor has driven the address bus with a column address, in response to the first falling edge of $\overline{CAS}$, the column latch 42 stores the column address and the array 38 loads the data stored at this column address into the buffers 72, which place the data onto the DATA bus via the port 84. If the memory 10 is designed to operate in the page mode EDO only, the counter 54 may be omitted, and the input terminal 80 of the buffers 72 may be directly coupled to the output terminal 56 of the column latch 42.

Next, the processor transitions $\overline{CAS}$ high and places the next column address on the address bus. On the next falling edge of $\overline{CAS}$, the memory device 10 latches the next column address from the ADDRESS bus and drives the DATA bus with the data from this next column. This sequence continues until the end of the cycle, when the processor transitions $\overline{RAS}$ to a logic 1 for at least a predetermined time $t_{RP}$ before beginning the next cycle. As discussed above in conjunction with FIG. 7, even though both $\overline{CAS}$ and $\overline{RAS}$ are at a logic 1, the array 38 is not disabled from placing valid data onto the DATA bus via the buffers 72. The end of the page mode EDO read cycle may be triggered by another signal such as $\overline{WE}$ or $\overline{OE}$, or the last column of data placed onto the DATA bus may remain valid until the beginning of the next read or write cycle.

In operation during the conventional read cycle of FIG. 8, after the row address has propagated through the latch 24 and the decoder 32, after the decoder 32 has enabled the addressed row, and after the processor has driven the ADDRESS bus with a column address, in response to the first falling edge of $\overline{CAS}$, the column latch 42 stores the column address and the array 38 loads the data stored at this column address into the buffers 72, which place this data onto the DATA bus via the port 84. If the memory 10 is designed to operate in the conventional read mode only, the counter 54 may be omitted, and the input terminal 80 of the buffers 72 may be coupled directly to the output terminal 56 of the column latch 42. Next, the processor transitions $\overline{RAS}$ to a logic 1, and then transitions $\overline{CAS}$ to a logic 1 to disable the array 38 and the buffers 72 from outputting data. As discussed above in conjunction with FIG. 8, the control circuit 12 can be constructed to allow the data on the DATA bus to remain valid even after both $\overline{CAS}$ and $\overline{RAS}$ go inactive high.

FIG. 9 shows only one embodiment of the memory device 10. Many other embodiments of the memory device 10, however, may be used without departing from the spirit and scope of the invention.

Figure 10:
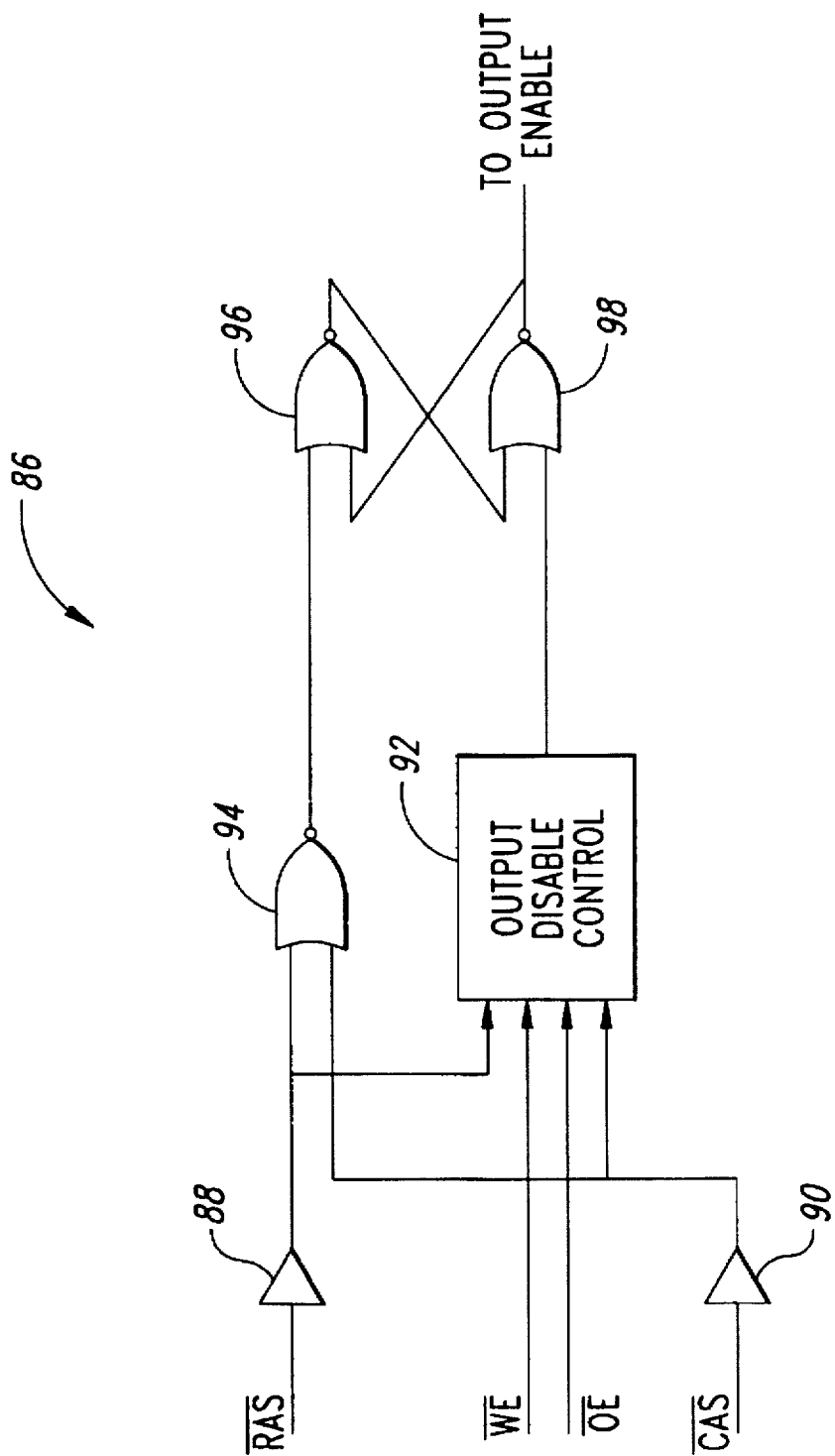
FIG. 10 is a circuit diagram of a portion of the extended-read control circuit of FIG. 7.

FIG. 10 is a circuit diagram of an extended-read circuit 86 of the extended-read control circuit 12 of FIG. 9. The circuit 86 allows the memory 10 to place additional data onto the DATA bus even when $\overline{RAS}$ is at a logic 1, and to place valid data onto the DATA bus even after both $\overline{CAS}$ and $\overline{RAS}$ transition to inactive logic levels. The circuit 86 includes buffers 88 and 90, which have inputs coupled to $\overline{RAS}$ and $\overline{CAS}$, respectively. The output of the buffer 90 is coupled to a first input of an output disable control circuit 92 and to a first input of a NOR gate 94. The output of the buffer 88 is coupled to a second input of the NOR gate 94 and to a second input of the disable circuit 92. The output of the NOR gate 94 is coupled to a first input of a NOR gate 96, which together with a NOR gate 98 forms a flip flop type circuit. Specifically, the output of the NOR gate 96 is coupled to a first input of the NOR gate 98, and the output of the NOR gate 98 is coupled to a second input of the NOR gate 96. The output of the NOR gate 98 provides an output enable signal that enables the buffers 72 (or the array 38 where the buffers 72 are omitted) to place data onto the DATA bus. A second input of the NOR gate 98 is coupled to the output of the disable circuit 92, which has third and fourth inputs coupled to $\overline{OE}$ and $\overline{WE}$ respectively.

In operation, when both $\overline{RAS}$ and $\overline{CAS}$ are logic 0, such as during a read cycle after the first falling edge of $\overline{CAS}$, the inputs to NOR gate 94 are both logic 0, and thus the output of the NOR gate 94 is at a logic 1. This logic 1 forces the output of the NOR gate 96 to a logic 0. The logic-0 $\overline{CAS}$ signal also propagates through the disable circuit 92 to the NOR gate 98. The two logic 0's at the inputs of the NOR gate 98 force its output to a logic 1, i.e., an enable state. This logic 1 enable signal reinforces the logic 0 at the output of the NOR gate 96. Thus, the circuit 86 is in a stable, enable state. As long as both inputs to the NOR gate 98 remain at logic 0, the output enable signal remains at a logic 1. Thus, the disable circuit 92 maintains the corresponding input to the NOR gate 98 at a logic low during the time the memory 10 is to output valid data. Even if $\overline{CAS}$ or $\overline{RAS}$ transition to a logic 1, the remaining input is still coupled to the logic-1 enable signal, which maintains the output of the NOR gate 96 at a logic 0. Therefore, once both $\overline{RAS}$ and $\overline{CAS}$ go to logic 0 and drive the enable signal to a logic 1, the only way to drive the enable signal to logic 0 is to drive the output of the disable circuit 92 to a logic 1. This is what the disable circuit 92 does to end the read cycle.

The end of the read cycle can be triggered in a number of ways. For example, the end of the previous read cycle may be triggered by the falling edge of $\overline{RAS}$ that begins the next read cycle. Or, $\overline{WE}$ may be pulsed or $\overline{OE}$ driven to an inactive logic 1. Also, the processor may generate an additional $\overline{CAS}$ falling edge after the desired data has been read. Or, a timed output enable signal may be used. That is, the disable circuit 92 would maintain the enable signal active for a predetermined time after both $\overline{CAS}$ and $\overline{RAS}$ went low. Furthermore, although described as working when the output enable signal is active at a logic 1, and $\overline{RAS}$, $\overline{CAS}$, $\overline{WE}$, and $\overline{OE}$ are active at logic 0, the circuit 86 can be designed to operate when the active logic levels for one or more of these signals is different.

Figure 11:
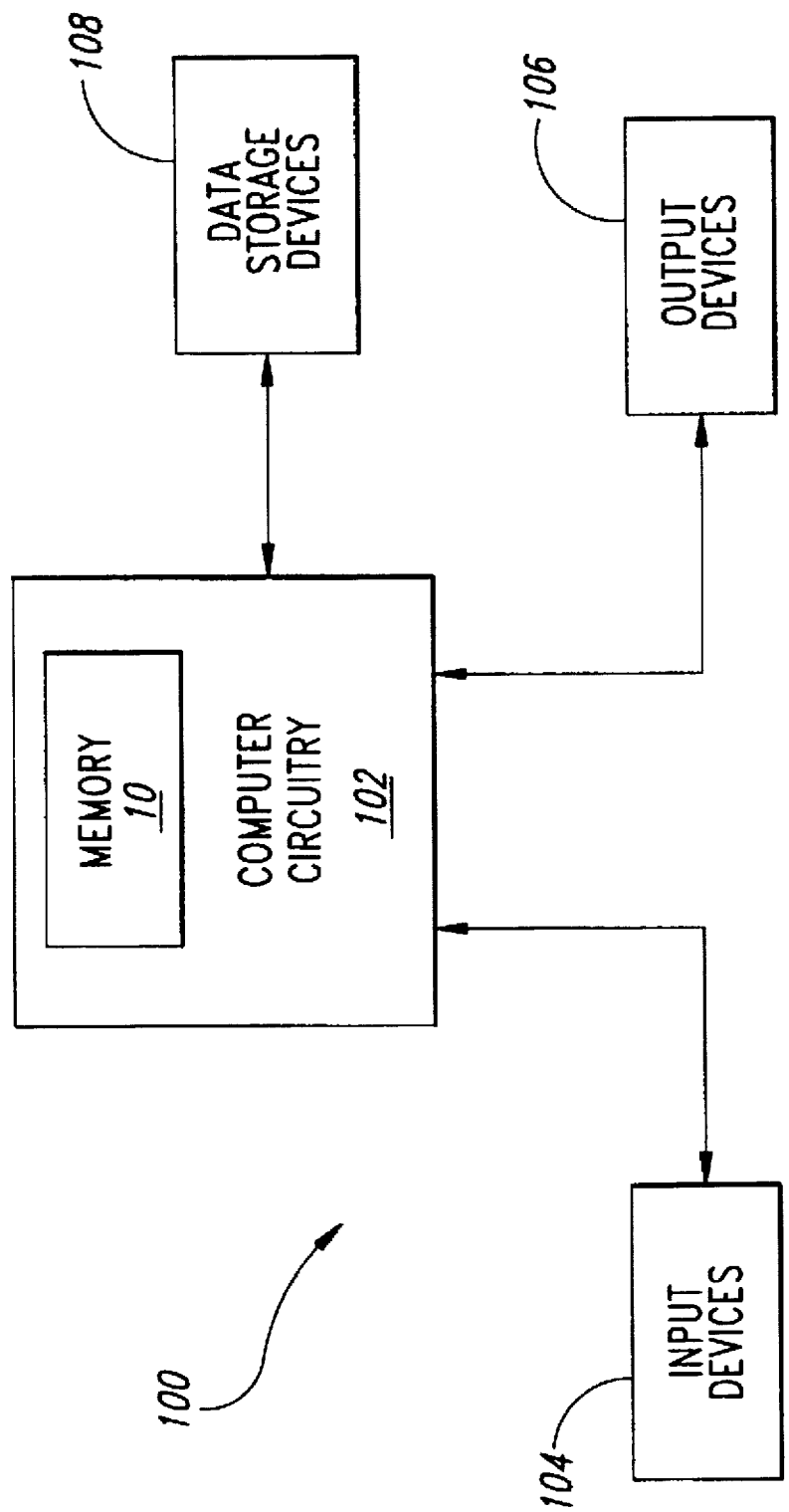
FIG. 11 is a block diagram of a computer system that incorporates the memory device of FIG. 9.

FIG. 11 is a block diagram of a computer system 100 that uses the memory device 10 of FIG. 9. The computer system 100 includes computer circuitry 102 for performing computer functions, such as executing software to perform desired calculations and tasks. Circuitry 102 typically contains a processor (not shown) and the memory 10 as shown. One or more input devices 104, such as a keypad or a mouse, are coupled to computer circuitry 102 and allow an operator (not shown) to manually input data thereto. One or more output devices 106 are coupled to computer circuitry 32 to provide to the operator data generated by computer circuitry 102. Examples of output devices 106 include a printer and a video display unit. One or more data storage devices 108 are coupled to the computer circuitry 102 to store data on or retrieve data from external storage media (not shown). Examples of storage devices 108 and storage media include drives that accept hard and floppy disks, tape cassettes, and compact-disc read only memories (CD-ROMs). Computer circuitry 102 also includes the ADDRESS and DATA buses of FIG. 9, and a control bus that carries signals that include $\overline{RAS}$, $\overline{CAS}$, $\overline{WE}$, and $\overline{OE}$.

It will also be evident that, although specific embodiments of the invention have been described herein for purposes of illustration, various modifications may be made without deviating from the spirit and scope of the invention. For example, there are many other read modes that were not discussed for purposes of clarity. These other read modes, however, may also be shortened by applying to them either the positive row setup technique, the extended read technique, or both, in manners similar to those discussed above.

We claim:

1. A memory device, comprising:

an array of memory cells arranged in rows and columns;

a row-address decoder coupled to said array and coupled to receive a row address and a row address strobe, said row-address decoder operable to allow said row address to propagate therethrough while said row address strobe is at an inactive logic level and operable to detect a transition of said row address strobe from said inactive logic level to an active logic level, and that in response to said transition, is operable to enable a row of memory cells selected by said row address;

a row-address latch coupled to receive said row address and said row address strobe, said row-address latch operable to store said row address in response to said transition of said row address strobe and to provide said row address to said row-address decoder;

a transition detector operable to monitor said row address and to detect a transition of said row address; and a delay circuit coupled to said row-address decoder, said row-address latch, and said transition detector, said delay circuit operable to delay said row-address decoder from enabling said row of memory cells and to delay said row-address latch from storing said row-address at least a predetermined time if said transition detector detects said transition.

2. A memory device comprising:

an array of memory cells arranged in rows and columns;

a row-address decoder coupled to said array and coupled to receive a row address and a row address strobe, said row-address decoder operable to allow said row address to propagate therethrough while said row address strobe is at an inactive logic level and operable to detect a transition of said row address strobe from said inactive logic level to an active logic level, and that in response to said transition, is operable to enable a row of memory cells selected by said row address;

a row-address latch coupled to receive said row address and said row address strobe, said row-address latch operable to store said row address in response to said transition of said row address strobe and to provide said row address to said row-address decoder;

a monitor operable to detect a transition of said row address; and a delay circuit coupled to said monitor, said row-address decoder, and said row-address latch, and coupled to receive said row address strobe, said delay circuit operable to communicate said transition of said row address strobe to said row-address latch and to said row-address decoder no earlier than a predetermined time after said transition of said row address.

3. A memory device, comprising:

an address bus;

a row address strobe line;

an array of memory cells arranged in rows and columns, said array having row-select and control inputs, and a data output;

a positive-set-up row latch having an address input coupled to said address bus, a latch input coupled to said row address strobe line, and an output;

a positive-set-up row decoder having an address input coupled to said output of said row latch, a control input coupled to said row address strobe line, and an output coupled to said row-select input of said array;

a transition detector having an input coupled to said address bus and an output; and a delay circuit interposed between said row address strobe line and both said row latch and row decoder, said delay circuit having a control input coupled to said output of said transition detector, a delay input coupled to said row address strobe line, and a delay output coupled to said latch input of said row latch and to said control input of said row decoder.

4. A memory device comprising:

an array of memory cells operable to store data and arranged in rows and columns;

a row latch operable to detect a first transition of a row address strobe from a first to a second logic level and to store a row address to said first transition of said row address strobe;

a row decoder coupled between said row latch and said array and operable to detect said first transition of said row address strobe and to allow said row address to propagate through said row decoder before said first transition and to enable a row of memory cells selected by said row address in response to said first transition;

a control circuit coupled to said array, said control circuit operable to receive said row address strobe and enable said array to output data when said row address strobe is at said second logic level, and to enable said array to output additional data when said row address strobe is at said first logic level;

a transition detector operable to monitor the row address for a transition thereof; and a delay circuit coupled to said row decoder, said row latch, and said transition detector, and operable to delay said strong of said row address and said enabling of said row of memory cells at least a predetermined time if said transition detector detects said transition of said row address.

5. A memory device, comprising:

an array of memory cells operable to store data and arranged in rows and columns;

a row latch operable to detect a first transition of a row address strobe from a first to a second logic level and to store a row address in response to said first transition of said row address strobe;

a row decoder coupled between said row latch and said array and operable to detect said first transition of said row address strobe and to allow said row address to propagate therethrough before said first transition and to enable a row of memory cells selected by said row address in response to said first transition;

a control circuit coupled to said array, said control circuit operable to receive said row address strobe and enable said array to output data when said row address strobe is at said second logic level, and to enable said array to output additional data when said row address strobe is at said first logic level;

a monitor operable to detect a transition of said row address; and a delay circuit coupled to said monitor, said row decoder, said row latch, and coupled to receive said row address strobe, said delay circuit operable to communicate said first transition of said row address strobe to said latch and said decoder at least a predetermined time after said transition of said row address.

6. A memory device comprising:

an address bus;

a row address strobe line;

an array of memory cells arranged in rows and columns, said array having row-select and control inputs, and a data output;

a row latch having an address input coupled to said address bus, a latch input coupled to said row address strobe line, and an output;

a positive-set-up row decoder having an address input coupled to said output of said row latch, a control input coupled to said row address strobe line, and an output coupled to said row-select input of said array;

an extended-read control circuit having a first input coupled to said row address strobe line and an output coupled to said control input of said array;

a transition detector having an input coupled to said address bus and an output; and a delay circuit having a control input coupled to said output of said transition detector, a delay input coupled to said row address strobe line, and a delay output coupled to said latch input of said row latch and said control input of said row decoder.

7. A method for reading data from a memory device, comprising:

allowing a row address to propagate through a decoder while a row address strobe is in an inactive state;

detecting a transition of said row address strobe from said inactive to an active state; and in response to said transition of said row address strobe, latching said row address and enabling a row of memory cells selected by said row address.

8. The method of claim 7, further comprising:

monitoring said row address while said row address strobe is in said inactive state;

detecting a transition of said row address; and delaying said latching and enabling at least a predetermined time after said detecting said transition of said row address.

9. The method of claim 7, further comprising:

detecting a transition of a column address strobe from an inactive to an active state; and after said latching, providing data stored at a column address and said row address in response to said transition of said column address strobe.

10. The method of claim 7, further comprising after said latching:

detecting a first transition of a column address strobe from an active to an inactive state;

in response to said first transition of said column address strobe, latching a base column address, latching in a first data buffer data stored at said base column address and said row address, latching in a second data buffer data stored at an indexed column address and said row address, and enabling said first data buffer to provide said data latched therein;

detecting a second transition of said column address strobe; and enabling said second data buffer to provide said data latched therein in response to said second transition of said column address strobe.

11. The method of claim 7, further comprising after said latching said row address:

detecting a first transition of a column address strobe from an inactive to an active state;

loading into a counter as a count value a column address in response to said first transition of said column address strobe;

detecting a number of transitions of said column address strobe following said first transition; and in response to each of said number of transitions of said column address strobe following said first transition, providing data stored at said row address and a column address identified by said count value, and updating said count value.

12. A method for reading data from a memory device, comprising:

detecting a transition of a row address strobe from a first to a second level;

latching a row address in response to said transition of said row address strobe; and providing data stored in a first memory cell located at a first column address and said row address when said row address strobe is at said second level, and providing data stored in a second memory cell located at a second column address and said row address when said row address strobe is at said first level.

13. The method of claim 12 further comprising:

detecting a transition of a column address strobe from a third to a fourth level; and wherein said providing data stored in first and second memory cells further include providing said data in response to said transition of said column address strobe.

14. The method of claim 12 wherein said providing data stored in first and second memory cells further comprise:

detecting a first transition of a column address strobe from a third to a fourth level;

in response to said first transition of said column address strobe, latching an initial column address and a number of additional column addresses, latching said data in a first data buffer, latching in each additional data buffer data saved at said row address and one of said additional column addresses, and providing said data in said first data buffer;

detecting a number of subsequent transitions of said column address strobe; and in response to each of said number of subsequent transitions of said column address strobe, providing said data latched in one of said additional data buffers.

15. The method of claim 14 wherein:

said first transition of said column address strobe occurs when said row address strobe is at said second level; and at least one of said subsequent transitions of said column address strobe occurs when said row address strobe is at said first level.

16. The method of claim 12 wherein said providing data stored in first and second memory cells further comprise:

detecting a first transition of a column address strobe;

loading into a counter as a count value said column address in response to said first transition of said column address strobe;

detecting a number of subsequent transitions of said column address strobe; and in response to each of said number of said subsequent transitions of said column address strobe, providing data stored at said row address and a column address identified by said count value, and updating said count value.

17. The method of claim 16 wherein:

said first transition of said column address strobe occurs when said row address strobe is at said second level; and at least one of said subsequent transitions of said column address strobe occurs when said row address strobe is at said first level.

18. A method for reading data from a memory device, comprising:

allowing a row address to propagate through a decoder while a row address strobe is at a first logic level;

detecting a first transition of said row address strobe from said first to a second logic level;

latching said row address in response to said first transition of said row address strobe;

detecting a second transition of said row address strobe from said second to said first logic levels; and after said second transition of said row address strobe, and while said row address strobe is at said first logic level, providing additional data saved at a column address and said row address.

19. The method of claim 18 wherein said allowing comprises:

detecting a transition of said row address; and delaying said latching at least a predetermined time after said transition of said row address.

20. The method of claim 18, further comprising:

detecting a transition of a column address strobe from a third to a fourth logic level; and wherein said providing additional data further comprises providing said data in response to said transition of said column address strobe.

21. The method of claim 20 wherein said first and third logic levels are equal and said second and fourth logic levels are equal.

22. The method of claim 18 wherein said providing further comprises:

detecting a first transition of a column address strobe from a third to a fourth logic level;

in response to said first transition of said column address strobe, latching a base column address and one or more indexed column addresses, latching in a first data buffer data stored at said base column address and said row address, respectively latching in one or more additional data buffers data stored at said indexed column addresses and said row address, and providing said data latched in said first output buffer;

detecting one or more subsequent transitions of said column address strobe; and in response to each of said one more subsequent transitions of said column address strobe, providing said data latched in one of said additional data buffers.

23. The method of claim 22 wherein:

said first transition of said column address strobe occurs when said row address strobe is at said second logic level; and at least one of said subsequent transitions of said column address strobe occurs after said second transition of said row address strobe and while said row address strobe is at said first logic level.

24. The method of claim 18 wherein said providing comprises:

detecting a first transition of a column address strobe from a third to a fourth logic level;

loading into a counter as a count value a column address in response to said first transition of said column address strobe;

detecting one or more transitions of said column address strobe following said first transition of said column address strobe; and in response to each of said one or more transitions of said column address strobe following said first transition of said column address strobe, providing data stored at said row address and a column address pointed to by said count value, and updating said count value.

25. The method of claim 24 wherein:

said first transition of said column address strobe occurs when said row address strobe is at said second logic level; and at least one of said subsequent transitions of said column address strobe occurs after said second transition of said row address strobe and while said row address strobe is at said first logic level.

26. A computer system, comprising:

a data input device;

a data output device; and computing circuitry coupled to said data input and output devices and including address, data, and control busses, and including a memory device having, an array of memory cells arranged in rows and column, a row-address decoder coupled to said array and coupled to receive a row address and a row address strobe, said row-address decoder operable to allow said row address to propagate therethrough while said row address strobe is at an inactive logic level and to detect a transition of said row address strobe from said inactive level to an active level, said row-address decoder being responsive to said transition of said row address strobe, is operable to enable a row of memory cells selected by said row address, and a row-address latch coupled to receive said row address and said row address strobe, said row-address latch operable to store said row address in response to said transition of said row address strobe and to provide said row address to said row-address decoder, a transition detector operable to monitor the row address and to detect a transition thereof, and a delay circuit coupled to said row-address decoder, said row-address latch, and said transition detector, said delay circuit operable to delay said row enabling and said storing of said row address at least a predetermined time if said transition detector detects said transition.

27. A computer system, comprising:

a data input device;

a data output device; and computing circuitry coupled to said data input and output devices and including address, data, and control busses, and including a memory device having, an array of memory cells arranged in rows and columns, a row-address decoder coupled to said array and coupled to receive a row address and a row address strobe, said row-address decoder operable to allow said row address to propagate therethrough while said row address strobe is at an inactive logic level and to detect a transition of said row address strobe from said inactive level to an active level, and that in response to said transition of said row address strobe, is operable to enable a row of memory cells selected by said row address, and a row-address latch coupled to receive said row address and said row address strobe, said row-address latch operable to store said row address in response to said transition of said row address strobe and to provide said row address to said row-address decoder, a monitor operable to detect a transition of said row address, and a delay circuit coupled to said monitor, said row-address decoder, said row-address latch, and coupled to receive said row address strobe, said delay circuit operable to delay communication of said transition of said row address strobe to said latch and said decoder at least a predetermined time after said transition of said row address.

28. A computer system, comprising:

data input device;

a data output device; and computing circuitry coupled to said data input and output devices and including address, data, and control busses, said computer circuitry including a memory device having:

an array of memory cells operable to store data and arranged in rows and columns, a row latch operable to detect a first transition of a row address strobe from a first to a second logic level and to store a row address in response to said first transition of said row address strobe, a row decoder coupled between said row latch and said array and operable to detect said first transition of said row address strobe, to allow said row address to propagate therethrough before said first transition and to enable a row of memory cells selected by said row address in response to said first transition, and a control circuit coupled to said array, said control circuit operable to receive said row address strobe and enable said array to output data when said row address strobe is at said second logic level and to output additional data when said row address strobe is at said first logic level, a transition detector operable to monitor the row address and to detect a transition thereof, and a delay circuit coupled to said row decoder, said row latch, and said transition detector, and operable to delay said storing of said row address and said enabling of said row of memory cells at least a predetermined time after said monitor detects said transition of said row address.

29. A computer system, comprising data input device;

a data output device; and computing circuitry coupled to said data input and output devices and including address, data, and control busses, said computer circuitry including a memory device having, an array of memory cells operable to store data and arranged in rows and columns, a row latch operable to detect a first transition of a row address strobe from a first to a second logic level and to store a row address in response to said first transition of said row address strobe, a row decoder coupled between said row latch and said array and operable to detect said first transition of said row address strobe, to allow said row address to propagate therethrough before said first transition and to enable a row of memory cells selected by said row address in response to said first transition, and a control circuit coupled to said array, said control circuit operable to receive said row address strobe and enable said array to output data when said row address strobe is at said second logic level and to output level and to output additional data when said row address strobe is at first logic level, a monitor operable to detect a transition of said row address, and a delay circuit coupled to said monitor, said row decoder, said row latch, and coupled to receive said row address strobe, said delay circuit operable to delay communication of said transition of said row address strobe to said latch and said decoder at least a predetermined time after said transition of said row address.

* * * * *

UNITED STATES PATENT AND TRADEMARK OFFICE
CERTIFICATE OF CORRECTION

PATENT NO. : 5,715,208
DATED : February 3, 1998
INVENTOR(S) : Casper et al.

It is certified that error appears in the above-identified patent and that said Letters Patent is hereby corrected as shown below:

| | | |
|---|---|---|
| Column 14, line 11 | "strong" | -- storing -- |
| Column 17, line 66 | "device:" | -- device; -- |
| Column 20, line 18 | after "output" | delete --level and to output -- |

Signed and Sealed this

Twenty-ninth Day of May, 2001

Attest:

NICHOLAS P. GODICI

Attesting Officer

Acting Director of the United States Patent and Trademark Office